(12) United States Patent
Wang

(10) Patent No.: US 11,764,300 B2
(45) Date of Patent: Sep. 19, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 30 days.

(21) Appl. No.: 17/229,508

(22) Filed: Apr. 13, 2021

(65) Prior Publication Data

US 2021/0359126 A1 Nov. 18, 2021

(30) Foreign Application Priority Data

May 13, 2020 (CN) .......................... 202010402541.2

(51) Int. Cl.
*H01L 29/78* (2006.01)
*H01L 29/06* (2006.01)
*H01L 29/66* (2006.01)
*H01L 21/8234* (2006.01)

(52) U.S. Cl.
CPC .... *H01L 29/785* (2013.01); *H01L 21/823431* (2013.01); *H01L 29/0649* (2013.01); *H01L 29/66553* (2013.01); *H01L 29/66795* (2013.01)

(58) Field of Classification Search
CPC ............. H01L 29/785; H01L 29/66795; H01L 21/823431; H01L 21/823462
See application file for complete search history.

(56) References Cited

U.S. PATENT DOCUMENTS

| | | | |
|---|---|---|---|
| 2015/0079751 A1* | 3/2015 | Alptekin | H01L 29/0847 438/283 |
| 2016/0181428 A1* | 6/2016 | Chen | H01L 29/7856 257/288 |
| 2019/0006515 A1* | 1/2019 | Cheng | H01L 21/76877 |
| 2021/0098471 A1* | 4/2021 | Chen | H01L 21/823475 |

* cited by examiner

*Primary Examiner* — Tuan A Hoang
(74) *Attorney, Agent, or Firm* — Anova Law Group, PLLC

(57) ABSTRACT

A semiconductor structure and its fabrication method are provided. The method includes: providing a substrate; forming an isolation structure on the substrate; forming a gate structure on the isolation structure; forming a first opening in the gate structure; and forming a first conductive structure in the first opening. Sidewall surfaces of the first conductive structure are in contact with a gate electrode layer of the gate structure.

18 Claims, 8 Drawing Sheets

SEMICONDUCTOR STRUCTURE AND FABRICATION METHOD THEREOF

CROSS-REFERENCES TO RELATED APPLICATION

This application claims the priority of Chinese Patent Application No. 202010402541.2, filed on May 13, 2020, the content of which is incorporated herein by reference in its entirety.

TECHNICAL FIELD

The present disclosure generally relates to the field of semiconductor technology and, more particularly, relates to a semiconductor structure and its fabrication method.

BACKGROUND

As semiconductor technologies develop, semiconductor devices are developed toward a direction with a higher device density and a higher integration level. A transistor is one of the most fundamental devices and is widely used. With developments of the device density and the integration level of the semiconductor devices, a length of a gate in a planar transistor decreases. Correspondingly, a controlling ability of a conventional planar transistor on channel currents becomes weaker, causing short channel effects and serious leakage current problems. The semiconductor device has a poor performance.

To better alleviate the short channel effects and suppress the leakage currents, fin field effect transistors (FinFETs) are widely used. A FinFET is a multi-gate device.

A FinFET usually includes: fins on a semiconductor substrate; a dielectric layer on the semiconductor substrate covering a portion of sidewalls of the fins and with a top surface lower than top surfaces of the fins; gate structures crossing the fins and the dielectric layer to cover a portion of sidewalls and top surfaces of the fins; and sources and drains in the fins at two sides of each gate structure. Each gate structure includes: a gate dielectric layer on the top surface of the dielectric layer, on a portion of the sidewalls and bottom surfaces of the fins; a gate electrode layer on a top surface of the gate dielectric layer; and spacers on sidewalls of the gate electrode layer and the gate dielectric layer. To make the FinFET cooperate with other semiconductor devices to form a chip circuit, conductive structures including conductive plugs or electrical connection wires are necessary to be formed on surfaces of one or more of sources, drains, gate electrode layers of the FinFET.

However, the electrical performance of FinFETs in existing technologies needs to be improved.

SUMMARY

One aspect of the present disclosure provides a semiconductor structure. The semiconductor structure includes a substrate; an isolation structure on the substrate; a gate structure on the isolation structure including a first opening; and a first conductive structure in the first opening. Sidewall surfaces of the first conductive structure is in contact with a gate electrode layer of the gate structure.

Optionally, the first opening exposes a top surface of the isolation structure.

Optionally, the semiconductor structure further includes a plurality of fins discrete from each other on the substrate. The isolation structure covers a portion of sidewalls of the plurality of fins. A top surface of the isolation structure is lower than top surfaces of the plurality of fins. The gate structure crosses the plurality of fin structures.

Optionally, the semiconductor structure further includes source/drain doped layers in each of the plurality of fins at two sides of the gate structure; a second conductive structure on the source/drain doped layers, a first dielectric layer on the isolation structure, and a second dielectric layer on the first dielectric layer and the gate structure. A top surface of the second conductive structure is higher than the top surface of the gate structure. The first dielectric layer covers the gate structure and the source/drain doped layers, and exposes the top surface of the gate structure.

Optionally, the gate structure further includes a gate dielectric layer, a protective layer, and spacers. The gate electrode layer is disposed on the gate dielectric layer. The protective layer is disposed on the gate electrode layer. The spacers are disposed at sidewalls of the gate electrode layer and the protective layer. The second conductive structure is disposed on a portion of a surface of the protective layer, and is in contact with the spacers.

Optionally, the gate dielectric layer is made of a high-K dielectric material. The protective layer is made of a material including $SiN_x$. The spacers are made of a material including $SiN_x$, $SiO_2$, SiNO, or a combination thereof.

Optionally, the first conductive structure is disposed in the second dielectric layer and the gate structure. The second conductive structure is disposed in the first dielectric layer and the second dielectric layer. The second dielectric layer exposes top surfaces of the first conductive structure and the second conductive structure.

Optionally, the first conductive structure is made of a metal including tungsten.

Optionally, the second conductive structure is made of a metal including tungsten.

Another aspect of the present disclosure provides a fabrication method for forming a semiconductor structure. The method includes: providing a substrate; forming an isolation structure on the substrate; forming a gate structure on the isolation structure; forming a first opening in the gate structure; and forming a first conductive structure in the first opening. Sidewall surfaces of the first conductive structure are in contact with a gate electrode layer of the gate structure.

Optionally, the first opening exposes a top surface of the isolation structure.

Optionally, the method further includes forming a plurality of discrete fins on the substrate. The isolation structure covers a portion of sidewalls of the plurality of fins. A top surface of the isolation structure is lower than top surfaces of the plurality of fins. The gate structure crosses the plurality of fin structures.

Optionally, the method further includes: forming source/drain doped layers in each of the plurality of fins at two sides of the gate structure; forming a first dielectric layer on the isolation structure; forming a second dielectric layer on the first dielectric layer and the gate structure; and forming a second conductive structure on the source/drain doped layers. A top surface of the second conductive structure is higher than the top surface of the gate structure. The first dielectric layer covers the gate structure and the source/drain doped layers, and exposes the top surface of the gate structure.

Optionally, the first conductive structure and the second conductive structure are formed by: forming a second opening in the second dielectric layer and the first dielectric layer, to expose top surfaces of the source/drain doped layers;

forming a third opening in the second dielectric layer, to expose the first opening; forming an initial conductive structure in the first opening, the second opening, the third opening, and on the second dielectric layer; planarizing the initial conductive structure until exposing the top surface of the second dielectric layer, to form the first conductive structure in the first opening and in the third opening; and forming the second conductive structure in the second opening.

Optionally, the initial conductive structure is planarized by a chemical mechanical polishing process.

Optionally, the first opening, the second opening, the third opening are formed by: etching the gate structure until exposing the top surface of the isolation structure, to form the first opening in the gate structure; forming the second dielectric layer in the first opening, on the gate structure, and on the first dielectric layer; forming a patterned layer on the second dielectric layer, wherein the patterned layer is provided with a patterned opening exposing a portion of a top surface of the second dielectric layer; and etching the second dielectric layer and the first dielectric layer by using the patterned layer as a mask until exposing the top surfaces of the source/drain doped layers and the isolation structure, to form the second opening in the second dielectric layer and the first dielectric layer, and form the third opening in the second dielectric layer, wherein the third opening exposes the first opening.

Optionally, the patterned layer is formed by: forming an initial patterned layer on the second dielectric layer; forming a photoresist layer on the initial patterned layer; using an extremely-ultraviolet light source to perform exposing process on the photoresist layer, to form a photoresist opening in the photoresist layer, wherein the photoresist opening exposes a portion of the initial patterned layer; and etching the initial patterned layer by using the photoresist layer as a mask, to form the patterned layer.

Optionally, the gate structure further includes a gate dielectric layer, a protective layer, and spacers. The gate electrode layer is disposed on the gate dielectric layer. The protective layer is disposed on the gate electrode layer. The spacers are disposed at sidewalls of the gate electrode layer and the protective layer. The second conductive structure is disposed on a portion of a surface of the protective layer, and is in contact with the spacers.

Optionally, the gate dielectric layer is made of a high-K dielectric material. The protective layer is made of a material including $SiN_x$. The spacers are made of a material including $SiN_x$, $SiO_2$, SiNO, or a combination thereof.

Optionally, the first conductive structure is disposed in the second dielectric layer and the gate structure. The second conductive structure is disposed in the first dielectric layer and the second dielectric layer. The second dielectric layer exposes top surfaces of the first conductive structure and the second conductive structure.

Optionally, the first conductive structure is made of a metal including tungsten.

Optionally, the second conductive structure is made of a metal including tungsten.

In the present disclosure, the first conductive structure may be formed in the first opening, and the sidewall surfaces of the first conductive structure may be in contact with the gate electrode layer of the gate structure. Correspondingly, the contact area between the first conductive structure and the gate structure may be increased, and the contact resistance between the first conductive structure and the gate structure may be reduced. The electrical performance of the formed semiconductor structure may be improved.

Further, the first opening may expose the top surface of the isolation structure. Correspondingly, the sidewall surfaces of the first conductive structure may be in contact with the gate electrode layer of the gate structure maximally, and the contact resistance between the first conductive structure and the gate structure may be reduced maximally.

Further, the patterned layer may be formed by: forming an initial patterned layer on the second dielectric layer; forming a photoresist layer on the initial patterned layer; using an extremely-ultraviolet light source to perform exposing process on the photoresist layer, to form a photoresist opening in the photoresist layer, wherein the photoresist opening exposes a portion of the initial patterned layer; and etching the initial patterned layer by using the photoresist layer as a mask, to form the patterned layer. Compared to existing technologies where the second opening and the third opening are formed respectively by using two photoresist masks, in the present disclosure, by using the extremely-ultraviolet light source to perform the exposing process, the photoresist openings corresponding to the second opening and the third opening may be formed simultaneously in the photoresist layer by using a photoresist mask. Photoresist masks may be saved effectively. Correspondingly, the fabrication process may be simplified and the fabrication cost may be reduced.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The electrical performance of FinFETs in existing technologies needs to be improved.

Figure 1:
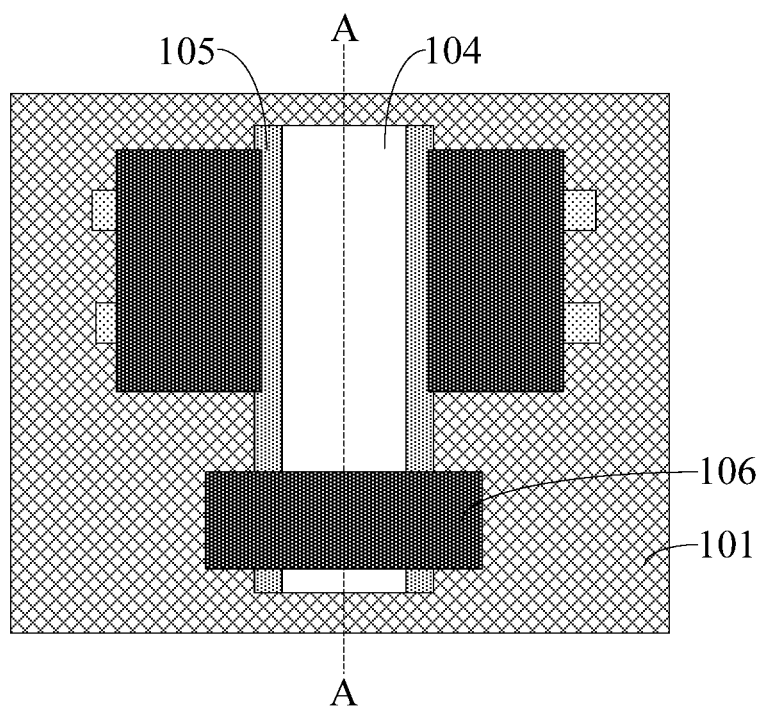
FIGS. 1-2 illustrate a semiconductor structure.
Figure 2:
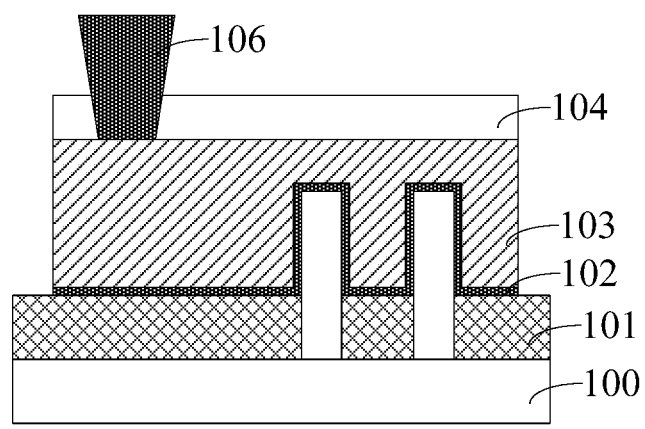

FIGS. 1-2 illustrate a semiconductor structure. As illustrated in FIG. 1 and FIG. 2 which is a cross-section view along an A-A direction in FIG. 1, a substrate 100 is provided and an isolation structure 101 is formed on the substrate 100. Then a gate structure is formed on the isolation structure. The gate structure includes a gate dielectric layer 102, a gate electrode layer 103 on the gate dielectric layer 102, a protective layer 104 on the gate electrode layer 103, and spacers 105 on sidewalls of the gate electrode layer 103 and the protective layer 104. A first opening (not illustrated) is formed in the gate structure, exposing a top surface of the gate electrode layer 103. A first conductive structure 106 is formed in the first opening.

In FIGS. 1-2, the first conductive structure 106 is formed on the gate structure, to electrically connect the gate structure to other device structures and realize electrical functions of the semiconductor structure. A feature size of the semiconductor device becomes smaller and smaller. In the first conductive structure 106, only a bottom surface is in contact with the gate electrode layer 103, and a contact area between the first conductive structure 106 and the gate structure is small. Correspondingly, contact resistance between the first conductive structure 106 and the gate structure is large, and the electrical performance of the formed semiconductor structure is poor.

The present disclosure provides a semiconductor structure and its fabrication method. In the present disclosure, a first conductive structure may be formed in a first opening and sidewalls of the first conductive structure may be in contact with a gate electrode layer of a gate structure, to increase a contact area between the first conductive structure and the gate structure. Correspondingly, contact resistance between the first conductive structure and the gate structure may be reduced, to improve the electrical performance of the semiconductor structure.

Figure 12:
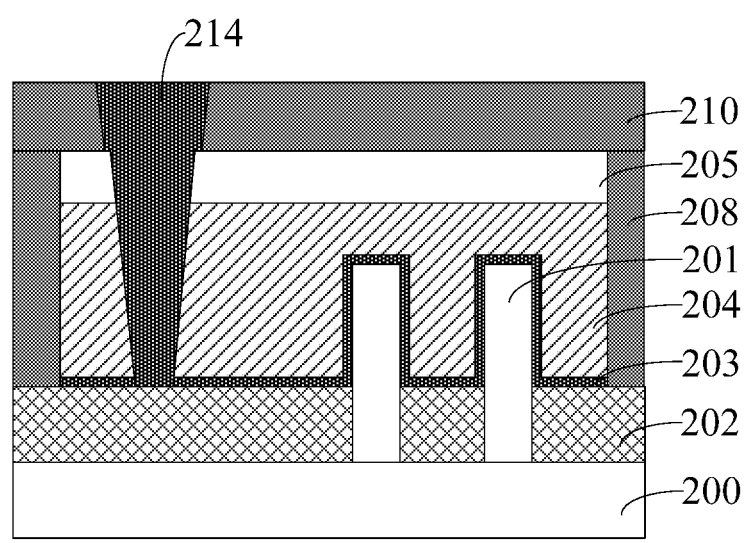
Figure 13:
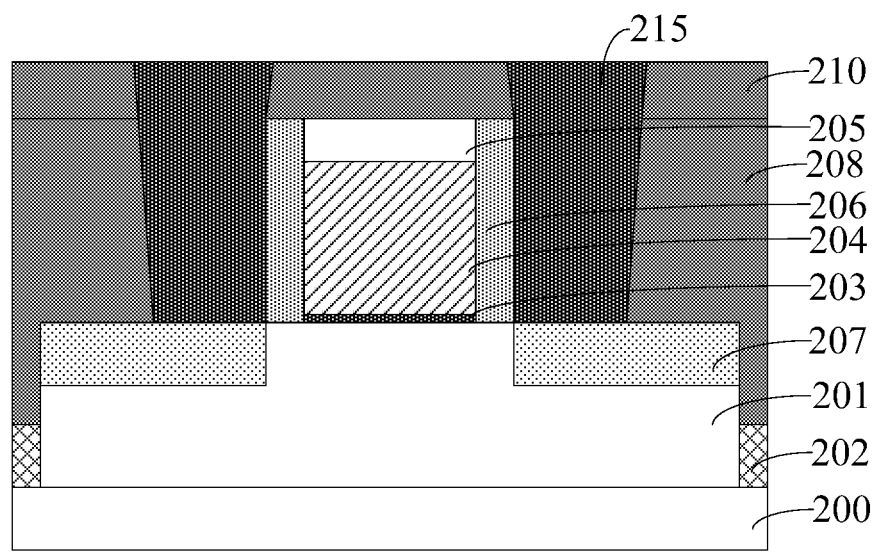
Figure 14:
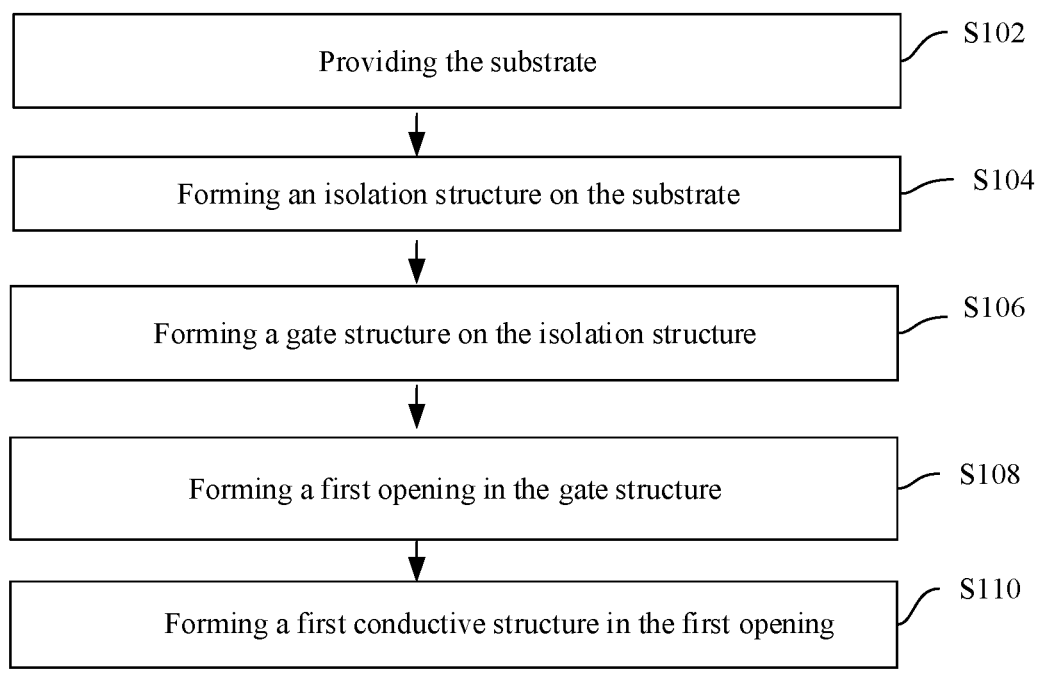
FIG. 14 illustrates an exemplary method for forming a semiconductor device according to various disclosed embodiments of the present disclosure.

FIGS. 3-13 illustrate semiconductor structures corresponding to certain stages for forming an exemplary semiconductor structure according to various disclosed embodiments of the present disclosure; and FIG. 14 illustrates an exemplary method for forming a semiconductor device according to various disclosed embodiments of the present disclosure.

Figure 3:
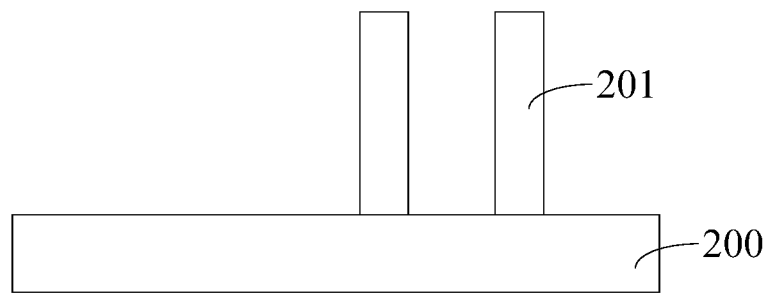
FIGS. 3-13 illustrate semiconductor structures corresponding to certain stages for forming an exemplary semiconductor structure according to various disclosed embodiments of the present disclosure.

As illustrated in FIG. 3, a substrate 200 may be provided (e.g. S102 in FIG. 14).

In one embodiment, the substrate 200 may be made of single-crystalline silicon. In other embodiments, the substrate 200 may be made of a material including polycrystalline silicon, amorphous silicon, or other semiconductor materials including germanium, SiGe, or GaAs.

As illustrated in FIG. 3, a plurality of discrete fins 201 may be formed on the substrate 200.

In one embodiment, the substrate 200 and the plurality of discrete fins 201 may be formed by: providing an initial substrate (not shown in the figures); forming a first patterned layer on the initial substrate; etching the initial substrate by using the first patterned layer as a mask, to form the substrate 200 and the plurality of discrete fins 201.

In one embodiment, the plurality of discrete fins 201 may be made of single-crystalline silicon. In other embodiments, the plurality of discrete fins 201 may be made of single-crystalline SiGe or other semiconductor materials.

In some embodiments, the substrate may not be provided with the plurality of discrete fins.

Figure 4:
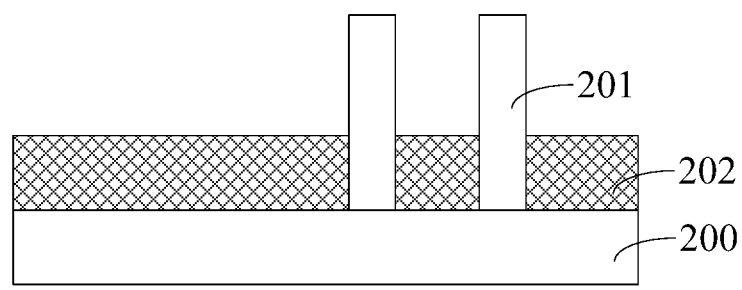

As illustrated in FIG. 4, an isolation structure 202 may be formed on the substrate 200 (e.g. S104 in FIG. 14).

In one embodiment, the isolation structure 202 may cover a portion of sidewalls of the plurality of discrete fins 201, and may have a top surface lower than top surfaces of the plurality of discrete fins 201.

The isolation structure 202 may be formed by: forming an initial isolation structure on the substrate 200 (not shown in the figures) to cover the plurality of discrete fins 201; planarizing the initial isolation structure to expose the top surfaces of the plurality of discrete fins 201; after planarizing the initial isolation structure, removing a portion of the initial isolation structure to form the isolation structure 202. The top surface of the isolation structure 202 may be lower than the top surfaces of the plurality of discrete fins 201.

In one embodiment, the initial isolation structure may be planarized by a wet etch process. In other embodiments, the initial isolation structure may be planarized by a process including a dry etch process or a chemical mechanical polishing (CMP) process.

In one embodiment, the isolation structure 202 may be made of $SiO_2$. In other embodiments, the isolation structure 202 may be made of a material including $SiN_x$ or SiNO.

Figure 5:
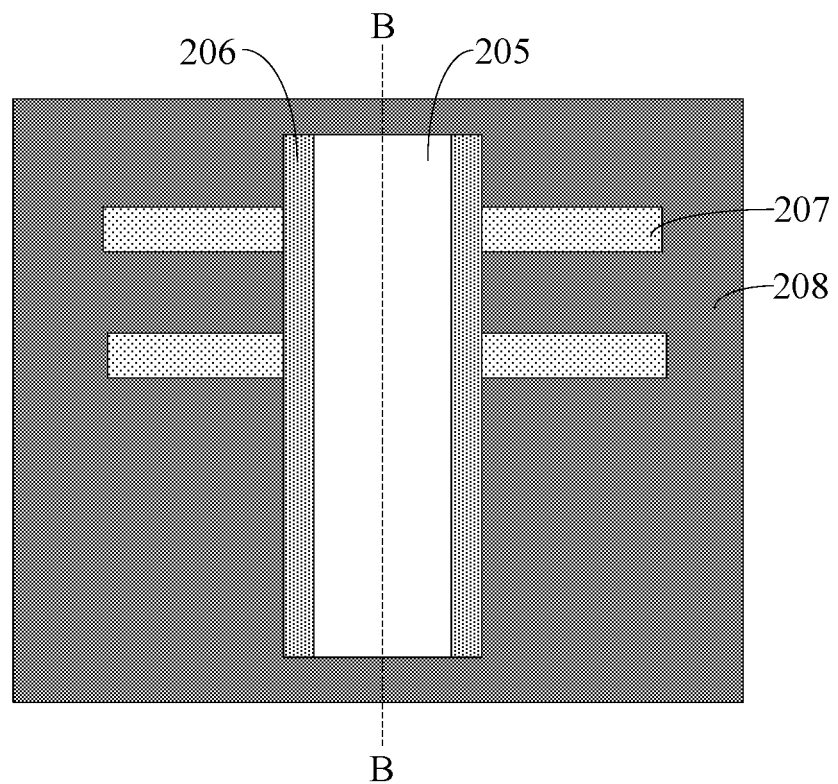
Figure 6:
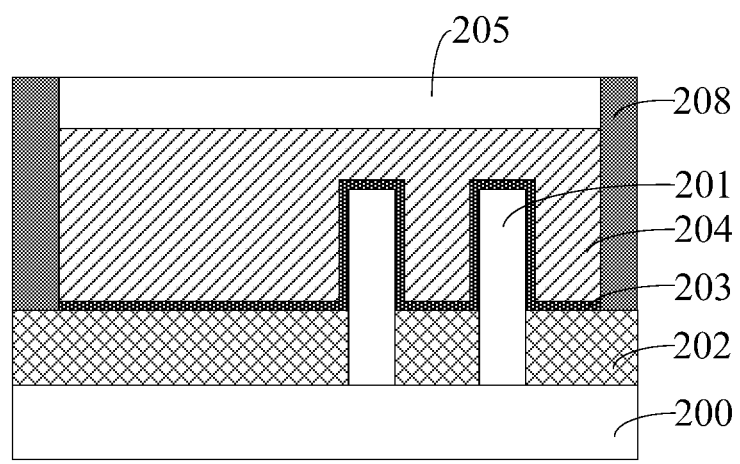

As illustrated in FIG. 5 and FIG. 6 which is a cross-section view along a B-B direction in FIG. 5, a gate structure may be formed on the isolation structure 202 (e.g. S106 in FIG. 14).

In one embodiment, the gate structure may cross the plurality of fins 201, and cover a portion of the sidewalls and top surfaces of the plurality of fins 201.

In one embodiment, the gate structure may include a gate dielectric layer 203, a gate electrode layer 204, a protective layer 205, and spacers 206. The gate electrode layer 204 may be disposed on the gate dielectric layer 203, and the protective layer 205 may be disposed on the gate electrode layer 204. The spacers 206 may be disposed at sidewalls of the gate electrode layer 204 and the protective layer 205.

In one embodiment, the gate dielectric layer 203 may be made of a material including a high-K dielectric material.

The gate electrode layer 204 may be made of a metal including tungsten, aluminum, copper, titanium, silver, gold, lead, nickel, or a combination thereof. In one embodiment, the gate electrode layer 204 may be made of tungsten.

The spacers 206 may be made of a material including $SiN_x$, $SiO_2$, SiNO, or a combination thereof. In one embodiment, the spacers 206 may be made of a material including $SiN_x$.

In one embodiment, the protective layer 205 may be made of a material including $SiN_x$.

As illustrated in FIG. 5 and FIG. 6, in one embodiment, source/drain doped layers 207 may be formed in the plurality of fins 201 at two sides of the gate structure, and a first dielectric layer 208 may be formed on the isolation structure 202. The first dielectric layer 208 may cover the source/drain doped layers 207 and the gate structure, while expose the top surface of the gate structure.

In one embodiment, the first dielectric layer 208, the gate structure, and the source/drain doped layers 207 may be formed by: forming the gate dielectric layer 203 on the isolation structure 202; forming a dummy gate electrode layer (not shown in the figures) on the gate dielectric layer 203; forming the spacers 206 on side surfaces of the dummy gate electrode layer; etching the plurality of fins 201 by using the dummy gate electrode layer and the spacers 206 as a mask, to forming source/drain openings (not shown in the figures); forming the source/drain doped layers 207 in the source/drain openings; forming an initial dielectric layer (not shown in the figures) on the isolation structure 202, to cover the dummy gate electrode layer, the spacers 206, and the source/drain doped layers 207; planarizing the initial dielectric layer until exposing the dummy gate electrode layer, to form the first dielectric layer 208; after forming the first dielectric layer, removing the dummy gate electrode layer to form an opening (not shown in the figures); forming the gate electrode layer 204 on a bottom surface of the opening; removing a portion of the gate electrode layer 204 by etching to form a gate opening (not shown in the figures); and forming the protective layer 205 in the gate opening.

In one embodiment, the first dielectric layer 208 may be made of a material including $SiO_2$. In other embodiments, the first dielectric layer 208 may be made of a material including a low-k dielectric material or an ultra-low-k dielectric material. The low-k dielectric material may be a material with a relative dielectric constant lower than 3.9. The ultra-low-k dielectric material may be a material with a relative dielectric constant lower than 2.5.

Figure 7:
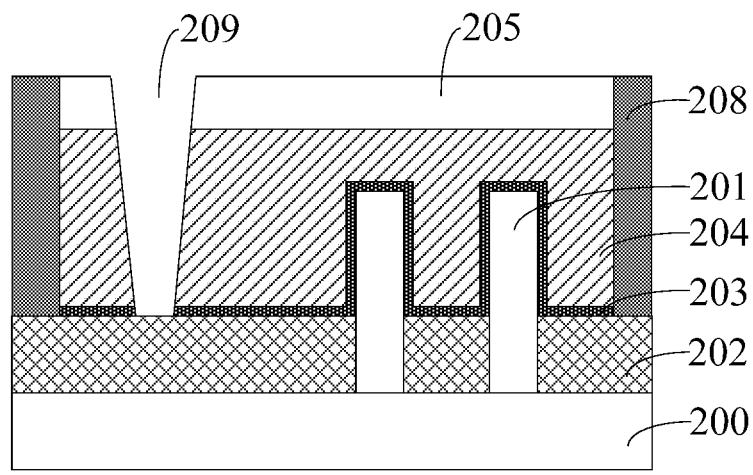

As illustrated in FIG. 7 which has a view angle same as FIG. 6, a first opening 209 may be formed in the gate structure (e.g. S108 in FIG. 14).

In one embodiment, the first opening 209 may expose the top surface of the isolation structure 202.

In subsequent processes, a first conductive structure may be formed in the first opening 209. Since the first opening 209 may expose the top surface of the isolation structure 202, the formed first conductive structure may be in contact with the gate structure maximally. Correspondingly, contact resistance between the first conductive structure and the gate structure may be reduced maximally.

In one embodiment, the first opening 209 may be formed by: forming a second patterned layer (not shown in the figures) on the gate structure, exposing a portion of the top surface of the gate structure; and etching the gate structure by using the second patterned layer as a mask until exposing the top surface of the isolation structure 202, to form the first opening 209 in the gate structure.

In one embodiment, the gate structure may be etched by a process including a dry etching process. The dry etching process may use an etching gas including $SF_6$ and $CH_4$. In some other embodiment, the dry etching process may use an etching gas including $HB_2$ and $CH_4$.

Figure 8:
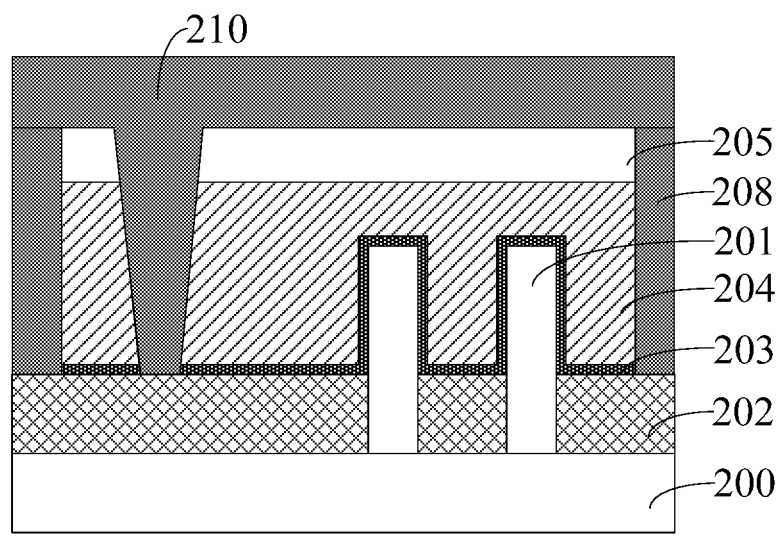

As illustrated in FIG. 8, after forming the first opening 209, a second dielectric layer 210 may be formed on the first dielectric layer 208 and the gate structure.

In one embodiment, the second dielectric layer 210 may fill up the first opening 209.

In one embodiment, the second dielectric layer 210 may be made of a material including $SiO_2$. In other embodiments, the second dielectric layer 210 may be made of a material including a low-k dielectric material or an ultra-low-k dielectric material. The low-k dielectric material may be a material with a relative dielectric constant lower than 3.9. The ultra-low-k dielectric material may be a material with a relative dielectric constant lower than 2.5.

After forming the second dielectric layer 210, the first conductive structure may e formed in the first opening 209. Sidewall surfaces of the first conductive structure may be in contact with the gate electrode layer of the gate structure. Subsequently, a second conductive structure may be formed on the source/drain doped layers 207. The first conductive structure and the second conductive structure may be formed in a process illustrated in FIG. 9 to FIG. 13.

Figure 9:
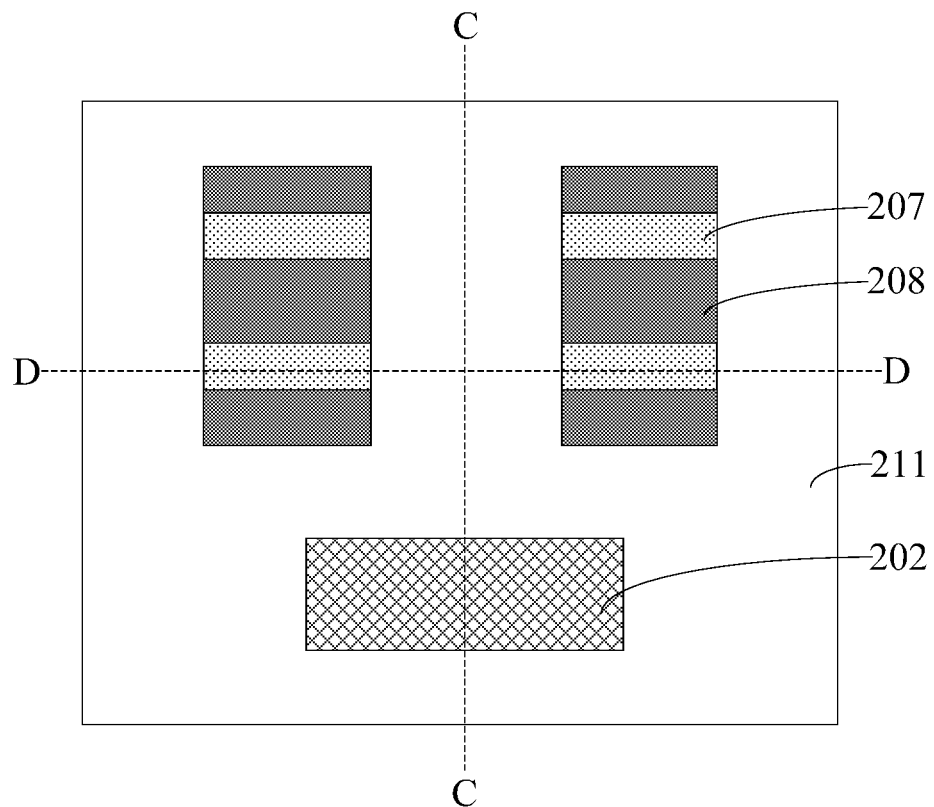
Figure 10:
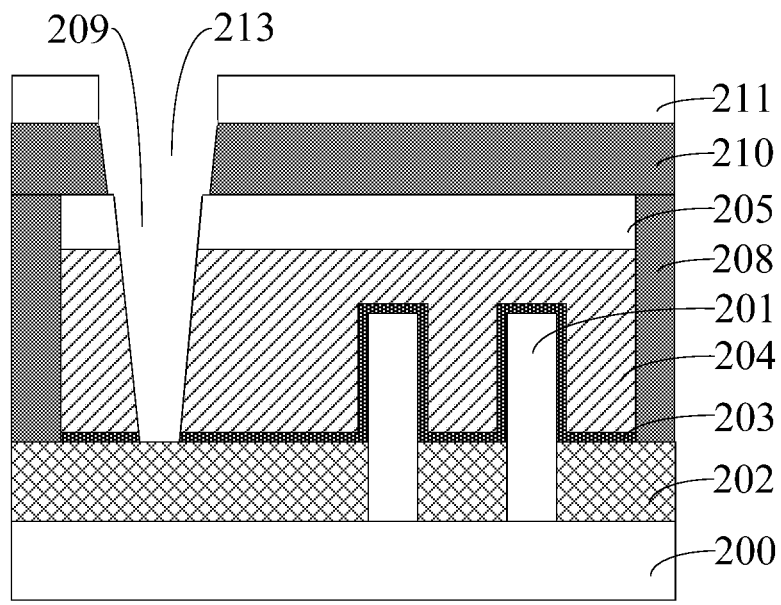
Figure 11:
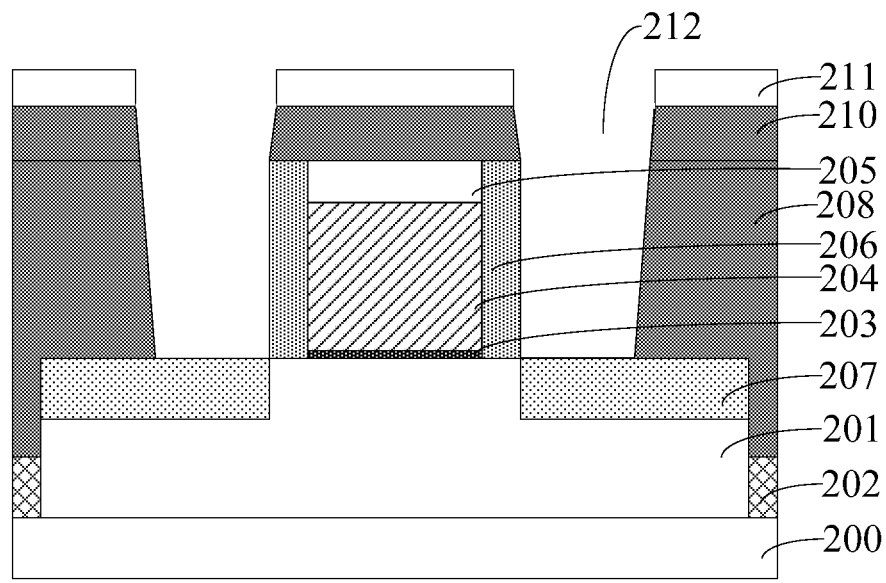

As illustrated in FIG. 9, FIG. 10 which is a cross-section view along a C-C' direction in FIG. 9, and FIG. 11 which is a cross-section view along a D-D' direction in FIG. 9, a patterned layer 211 may be formed on the second dielectric layer 210. The patterned layer 211 may be provided with a patterned opening exposing a top surface of the second dielectric layer 210. The second dielectric layer 210 and the first dielectric layer 208 may be etched by using the patterned layer 211 as a mask until exposing the top surfaces of the source/drain doped layers 207 and the isolation structure 202, to form the second opening 212 in the first dielectric layer 208 and the second dielectric layer 210. The second opening 212 may expose the top surfaces of the source/drain doped layers 207. A third opening 213 may be formed in the second dielectric layer 210 to expose the first opening 209.

In one embodiment, the patterned layer 211 may be formed by: forming an initial patterned layer (not shown in the figures) on the second dielectric layer 210; forming a photoresist layer (not shown in the figures) on the initial patterned layer; performing an exposing process on the photoresist layer by using an extremely-ultraviolet light source to form photoresist openings exposing a portion of the initial patterned layer; and etching the initial patterned layer by using the photoresist layer as a mask, to form the patterned layer 211.

Compared to existing technologies where the second opening 212 and the third opening 213 are formed respectively by using two photoresist masks. In the present disclosure, by using the extremely-ultraviolet light source to perform the exposing process, the photoresist openings corresponding to the second opening 212 and the third opening 213 may be formed simultaneously in the photoresist layer by using a photoresist mask. Photoresist masks may be saved effectively. Correspondingly, the fabrication process may be simplified and the fabrication cost may be reduced.

As illustrated in FIG. 12 which has a view angle same as FIG. 10 and FIG. 13 which has a view angle same as FIG. 11, an initial conductive structure may be formed in the first opening 209, the second opening 212, and the third opening 213. Then the initial conductive structure may be planarized until exposing the top surface of the second dielectric layer 210, to forming the first conductive structure 213 in the first opening 209 and the third opening 213 (e.g. S110 in FIG. 14). Subsequently, the second conductive structure 215 may be formed in the second opening 212.

By forming the first conductive structure 214 in the first opening 209 and making the sidewall surfaces of the first conductive structure 214 be in contact with the gate electrode layer 204 of the gate structure, the contact area between the first conductive structure 214 and the gate structure may be increased. Correspondingly, the contact resistance between the first conductive structure 214 and the gate structure may be reduced, improving the electrical performance of the semiconductor structure.

In one embodiment, the second conductive structure 215 may be disposed on a portion of the surface of the protective layer 205, and may be in contact with the spacers 206.

In one embodiment, the initial conductive structure may be planarized by a chemical mechanical polishing process.

In one embodiment, the first conductive structure 214 may be made of a metal including tungsten.

In one embodiment, the second conductive structure 215 may be made of a metal including tungsten.

The present disclosure also provides a semiconductor structure. As illustrated in FIG. 12 and FIG. 13, the semiconductor structure may include: a substrate 200; an isolation structure 202 on the substrate 200; a gate structure on the isolation structure 202; a first opening 209 in the gate structure; and a first conductive structure 214 in the first opening 209. Sidewall surfaces of the first conductive structure 214 may be in contact with a gate electrode layer 204 of the gate structure.

By forming the first conductive structure 214 in the first opening 209 and making the sidewall surfaces of the first conductive structure 214 in contact with the gate electrode layer 204 of the gate structure, the contact area between the first conductive structure 214 and the gate structure may be increased. Correspondingly, the contact resistance between the first conductive structure 214 and the gate structure may be reduced, improving the electrical performance of the semiconductor structure.

In one embodiment, the first opening 209 may expose a top surface of the isolation structure 202. Since the first opening 209 may expose the top surface of the isolation structure 202, the sidewall surfaces of the first conductive structure 214 may maximally be in contact with the gate electrode layer 204 of the gate structure. Correspondingly, the contact resistance between the first conductive structure 214 and the gate structure may be reduced maximally.

In one embodiment, the semiconductor structure may further include a plurality of discrete fins 201. The isolation structure 202 may cover a portion of sidewalls of the plurality of fins 201. The top surface of the isolation structure 202 may be lower than top surfaces of the plurality of fins 201. The gate structure may cross the plurality of fins 201, and may cover a portion of sidewalls and top surfaces of the plurality of fins 201.

In one embodiment, the semiconductor structure may further include source/drain doped layers 207 in the plurality of fins 201 at two sides of the gate structure, a second conductive structure 215 on the source/drain doped layers 207, a first dielectric layer 208 on the isolation structure 202, and a second dielectric layer 210 on the first dielectric layer 208 and the gate structure. A top surface of the second conductive structure 215 may be higher than the top surface of the gate structure. The first dielectric layer 208 may cover the gate structure and the source/drain doped layers 207, while expose the top surface of the gate structure.

In one embodiment, the gate structure may include a gate dielectric layer 203, a protective layer 205, and spacers 206. The gate electrode layer 204 may be disposed on the gate dielectric layer 203, the protective layer 205 may be disposed on the gate electrode layer 204, and the spacers 206 may be formed on sidewalls of the gate electrode layer 204 and the protective layer 205. The second conductive structure 215 may be disposed on a portion of a surface of the protective layer, and be in contact with the spacers 206.

In one embodiment, the gate dielectric layer 203 may be made of a material including a high-K dielectric material.

In one embodiment, the protective layer 205 may be made of a material including $SiN_x$.

The spacers 206 may be made of a material including $SiN_x$, $SiO_2$, SiNO, or a combination thereof. In one embodiment, the spacers 206 may be made of a material including $SiN_x$.

In one embodiment, the first conductive structure 214 may be disposed in the second dielectric layer 210 and the gate structure. The second conductive structure 215 may be disposed in the first dielectric layer 208 and the second dielectric layer 210. The second dielectric layer 210 may expose the top surfaces of the first conductive structure 214 and the second conductive structure 215.

In one embodiment, the first conductive structure 214 may be made of a metal including tungsten.

In one embodiment, the second conductive structure 215 may be made of a metal including tungsten.

In the present disclosure, the first conductive structure may be formed in the first opening, and the sidewall surfaces of the first conductive structure may be in contact with the gate electrode layer of the gate structure. Correspondingly, the contact area between the first conductive structure and the gate structure may be increased, and the contact resistance between the first conductive structure and the gate structure may be reduced. The electrical performance of the formed semiconductor structure may be improved.

Further, the first opening may expose the top surface of the isolation structure. Correspondingly, the sidewall surfaces of the first conductive structure may be in contact with the gate electrode layer of the gate structure maximally, and the contact resistance between the first conductive structure and the gate structure may be reduced maximally.

Further, the patterned layer may be formed by: forming an initial patterned layer on the second dielectric layer; forming a photoresist layer on the initial patterned layer; using an extremely-ultraviolet light source to perform exposing process on the photoresist layer, to form a photoresist opening in the photoresist layer, wherein the photoresist opening exposes a portion of the initial patterned layer; and etching the initial patterned layer by using the photoresist layer as a mask, to form the patterned layer. Compared to existing technologies where the second opening and the third opening are formed respectively by using two photoresist masks, in the present disclosure, by using the extremely-ultraviolet light source to perform the exposing process, the photoresist openings corresponding to the second opening and the third opening may be formed simultaneously in the photoresist layer by using a photoresist mask. Photoresist masks may be saved effectively. Correspondingly, the fabrication process may be simplified and the fabrication cost may be reduced.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
   a substrate;
   an isolation structure on the substrate;
   a gate structure on the isolation structure, wherein the gate structure includes a first opening;
   a first conductive structure in the first opening, wherein sidewall surfaces of the first conductive structure are in contact with sidewall surfaces of a gate electrode layer of the gate structure, and a bottom surface of the first conductive structure is in contact with a top surface of the isolation structure; and
   a plurality of fins discrete from each other on the substrate;
   wherein:
     the isolation structure covers a portion of sidewalls of the plurality of fins;
     the top surface of the isolation structure is lower than top surfaces of the plurality of fins; and
     the gate structure crosses the plurality of fins, and covers a portion of the sidewalls and top surfaces of the plurality of fin structures.

2. The structure according to claim 1, wherein:
   the first opening exposes the top surface of the isolation structure.

3. The structure according to claim 1, further including:
   source/drain doped layers in each of the plurality of fins at two sides of the gate structure;
   a second conductive structure on the source/drain doped layers, wherein a top surface of the second conductive structure is higher than the top surface of the gate structure;
   a first dielectric layer on the isolation structure, wherein the first dielectric layer covers the gate structure and the source/drain doped layers, and exposes the top surface of the gate structure; and
   a second dielectric layer on the first dielectric layer and the gate structure.

4. The structure according to claim 1, wherein:
   the gate structure further includes a gate dielectric layer, a protective layer, and spacers;
   the gate electrode layer is disposed on the gate dielectric layer;
   the protective layer is disposed on the gate electrode layer;
   the spacers are disposed at sidewalls of the gate electrode layer and the protective layer; and the second conductive structure is disposed on a portion of a surface of the protective layer, and in contact with the spacers.

5. The structure according to claim 4, wherein:
the gate dielectric layer is made of a high-K dielectric material;
the protective layer is made of a material including $SiN_x$; and
the spacers are made of a material including $SiN_x$, $SiO_2$, SiNO, or a combination thereof.

6. The structure according to claim 3, wherein:
the first conductive structure is disposed in the second dielectric layer and the gate structure;
the second conductive structure is disposed in the first dielectric layer and the second dielectric layer; and
the second dielectric layer exposes top surfaces of the first conductive structure and the second conductive structure.

7. The structure according to claim 1, wherein:
the first conductive structure is made of a metal, the metal including tungsten.

8. The structure according to claim 3, wherein:
the second conductive structure is made of a metal, the metal including tungsten.

9. A fabrication method of a semiconductor structure, comprising:
providing a substrate;
forming an isolation structure on the substrate;
forming a gate structure on the isolation structure;
forming a first opening in the gate structure;
forming a first conductive structure in the first opening, wherein sidewall surfaces of the first conductive structure are in contact with sidewall surfaces of a gate electrode layer of the gate structure, and a bottom surface of the first conductive structure is in contact with a top surface of the isolation structure; and
forming a plurality of fins discrete from each other on the substrate;
wherein:
the isolation structure covers a portion of sidewalls of the plurality of fins;
the top surface of the isolation structure is lower than top surfaces of the plurality of fins; and
the gate structure crosses the plurality of fins, and covers a portion of the sidewalls and top surfaces of the plurality of fin structures.

10. The method according to claim 9, wherein: the first opening exposes the top surface of the isolation structure.

11. The method according to claim 9, further including:
forming source/drain doped layers in each of the plurality of fins at two sides of the gate structure;
forming a first dielectric layer on the isolation structure, wherein the first dielectric layer covers the gate structure and the source/drain doped layers, and exposes the top surface of the gate structure;
forming a second dielectric layer on the first dielectric layer and the gate structure; and
forming a second conductive structure on the source/drain doped layers.

12. The method according to claim 11, wherein the first conductive structure and the second conductive structure are formed by:
forming a second opening in the second dielectric layer and the first dielectric layer, to expose top surfaces of the source/drain doped layers;
forming a third opening in the second dielectric layer, to expose the first opening;
forming an initial conductive structure in the first opening, the second opening, the third opening, and on the second dielectric layer;
planarizing the initial conductive structure until exposing the top surface of the second dielectric layer, to form the first conductive structure in the first opening and in the third opening; and
forming the second conductive structure in the second opening.

13. The method according to claim 12, wherein:
the initial conductive structure is planarized by a chemical mechanical polishing process.

14. The method according to claim 12, wherein the first opening, the second opening, the third opening are formed by:
etching the gate structure until exposing the top surface of the isolation structure, to form the first opening in the gate structure;
forming the second dielectric layer in the first opening, on the gate structure, and on the first dielectric layer;
forming a patterned layer on the second dielectric layer, wherein the patterned layer is provided with a patterned opening exposing a portion of a top surface of the second dielectric layer; and
etching the second dielectric layer and the first dielectric layer by using the patterned layer as a mask until exposing the top surfaces of the source/drain doped layers and the isolation structure, to form the second opening in the second dielectric layer and the first dielectric layer, and form the third opening in the second dielectric layer, wherein the third opening exposes the first opening.

15. The method according to claim 14, wherein the patterned layer is formed by:
forming an initial patterned layer on the second dielectric layer;
forming a photoresist layer on the initial patterned layer;
using an extremely-ultraviolet light source to perform exposing process on the photoresist layer, to form a photoresist opening in the photoresist layer, wherein the photoresist opening exposes a portion of the initial patterned layer; and
etching the initial patterned layer by using the photoresist layer as a mask, to form the patterned layer.

16. The method according to claim 15, wherein:
the gate structure further includes a gate dielectric layer, a protective layer, and spacers;
the gate electrode layer is disposed on the gate dielectric layer;
the protective layer is disposed on the gate electrode layer;
the spacers are disposed at sidewalls of the gate electrode layer and the protective layer; and
the second conductive structure is disposed on a portion of a surface of the protective layer, and in contact with the spacers.

17. The method according to claim 16, wherein:
the gate dielectric layer is made of a high-K dielectric material;
the protective layer is made of a material including $SiN_x$; and
the spacers are made of a material including $SiN_x$, $SiO_2$, SiNO, or a combination thereof.

18. The method according to claim 9, wherein:
the first conductive structure is made of a metal, the metal including tungsten, and the second conductive structure is made of a metal, the metal including tungsten.

* * * * *